(12) United States Patent
Choi et al.

(10) Patent No.: US 10,049,997 B2
(45) Date of Patent: Aug. 14, 2018

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Ju-Il Choi, Seongnam-si (KR); Hyoju Kim, Seoul (KR); Kwangjin Moon, Hwaseong-si (KR); Sujeong Park, Hwaseong-si (KR); Jubin Seo, Seongnam-si (KR); Naein Lee, Seoul (KR); Ho-Jin Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/440,621

(22) Filed: Feb. 23, 2017

(65) Prior Publication Data
US 2017/0358545 A1 Dec. 14, 2017

(30) Foreign Application Priority Data

Jun. 14, 2016 (KR) .................. 10-2016-0073958

(51) Int. Cl.
*H01L 23/00* (2006.01)

(52) U.S. Cl.
CPC ............. *H01L 24/13* (2013.01); *H01L 24/05* (2013.01); *H01L 24/11* (2013.01); *H01L 2224/0401* (2013.01); *H01L 2224/1147* (2013.01); *H01L 2224/11462* (2013.01); *H01L 2224/11614* (2013.01); *H01L 2224/11849* (2013.01); *H01L 2224/1308* (2013.01); *H01L 2224/13017* (2013.01); *H01L 2224/13026* (2013.01); *H01L 2224/13147* (2013.01); *H01L 2224/13155* (2013.01)

(58) Field of Classification Search
CPC ....................................... H01L 24/13
See application file for complete search history.

(56) References Cited

U.S. PATENT DOCUMENTS

| | | | |
|---|---|---|---|
| 7,008,867 | B2 | 3/2006 | Lei |
| 8,389,397 | B2 | 3/2013 | Lei et al. |
| 8,492,891 | B2 | 7/2013 | Lu et al. |
| 9,048,135 | B2 | 6/2015 | Hwang et al. |
| 9,214,436 | B2 | 12/2015 | Atanasova et al. |
| 2004/0140219 | A1 | 7/2004 | Bojkov et al. |

(Continued)

OTHER PUBLICATIONS

Min-Yuan Cheng et al., "Effects of direct current and pulse-reverse copper plating waveforms on the incubation behavior of self-annealing", Thin Solid Films 518 (2010), pp. 7468-7474.

(Continued)

*Primary Examiner* — William Harriston
(74) *Attorney, Agent, or Firm* — F. Chau & Associates, LLC

(57) ABSTRACT

A pad is disposed on a substrate. A bump structure is disposed on the pad and electrically connected to the pad. The bump structure includes a first copper layer and a second copper layer sequentially stacked on the pad and a solder ball on the second copper layer. A first X-ray diffraction (XRD) peak intensity ratio of (111) plane to (200) plane of the first copper layer is greater than a second XRD peak intensity ratio of (111) plane to (200) plane of the second copper layer.

28 Claims, 16 Drawing Sheets

(56) References Cited

U.S. PATENT DOCUMENTS

| | | | |
|---|---|---|---|
| 2004/0166661 A1* | 8/2004 | Lei | H01L 24/03 |
| | | | 438/614 |
| 2005/0142836 A1 | 6/2005 | Haze | |
| 2010/0300888 A1* | 12/2010 | Ponnuswamy | C25D 3/38 |
| | | | 205/157 |
| 2013/0062764 A1* | 3/2013 | Jin | H01L 23/3114 |
| | | | 257/738 |
| 2015/0380370 A1 | 12/2015 | Kraus et al. | |

OTHER PUBLICATIONS

Hsien-Ping Feng et al., "Behavior of Copper Removal by CMP and Its Correlation to Deposit Structure and Impurity Content", Journal of the Electrochemical Society, 155 (1), 2008, pp. H21-H25.

* cited by examiner

SEMICONDUCTOR DEVICE AND METHOD OF FABRICATING THE SAME

CROSS-REFERENCE TO RELATED APPLICATIONS

This application claims priority under 35 U.S.C. § 119 to Korean Patent Application No. 10-2016-0073958, filed on Jun. 14, 2016, in the Korean Intellectual Property Office, the disclosure of which is incorporated by reference in its entirety.

TECHNICAL FIELD

The present inventive concept relates to a semiconductor device and a method of fabricating the same.

DISCUSSION OF RELATED ART

Semiconductor devices include an electric connection structure (e.g., solder balls or bumps) providing an electric connection path to other semiconductor device or a printed circuit board.

SUMMARY

According to an exemplary embodiment of the present inventive concept, a semiconductor device is provided as follows. A pad is disposed on a substrate. A bump structure is disposed on the pad and electrically connected to the pad. The bump structure includes a first copper layer and a second copper layer sequentially stacked on the pad and a solder ball on the second copper layer. A first X-ray diffraction (XRD) peak intensity ratio of (111) plane to (200) plane of the first copper layer is greater than a second XRD peak intensity ratio of (111) plane to (200) plane of the second copper layer.

According to an exemplary embodiment of the present inventive concept, a semiconductor device is provided as follows. A pad is disposed on a substrate. A bump structure is disposed on the pad and electrically connected to the pad. The bump structure includes a first copper layer and a second copper layer sequentially stacked on the pad and a solder ball on the second copper layer. A twin boundary density in the first copper layer is greater than a twin boundary density in the second copper layer.

According to an exemplary embodiment of the present inventive concept, a method of fabricating a semiconductor device is provided as follows. A pad is formed on a substrate. An under-bump layer is formed to be electrically connected to the pad. A mask pattern with an opening is formed on the under-bump layer. A first copper layer, a second copper layer, and a solder layer are sequentially formed in the opening. The mask pattern is removed. A wet etching process is performed to etch a portion of the under-bump layer. The first copper layer is formed using a pulsed-plating process. The second copper layer is formed using a DC plating process.

According to an exemplary embodiment of the present inventive concept, a method of fabricating a semiconductor device is provided as follows. A pad is formed on a substrate. An under-bump layer is formed on the pad. A first copper layer is formed by electroplating the first copper layer at a first growth rate on the under-bump layer. A second copper layer is formed by electroplating the second copper layer at a second growth rate on the first copper layer. The second growth rate is greater than the first growth rate. A solder layer is on the second copper layer. A wet etching process is performed on the under-bump layer. The under-bump layer is etched to form an under-bump pattern.

BRIEF DESCRIPTION OF DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1A:
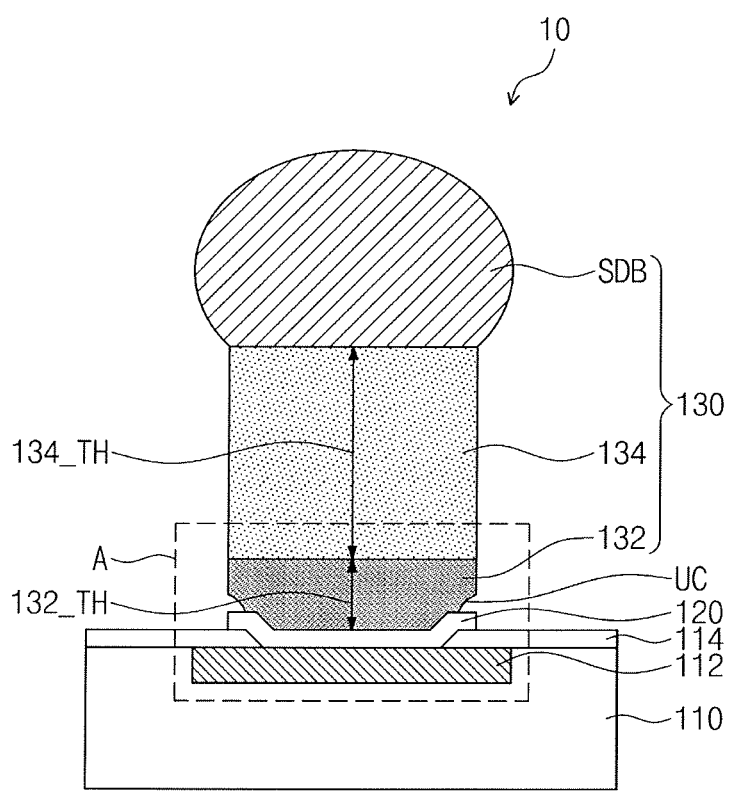
FIG. 1A is a sectional view illustrating a portion of a semiconductor device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 1B:
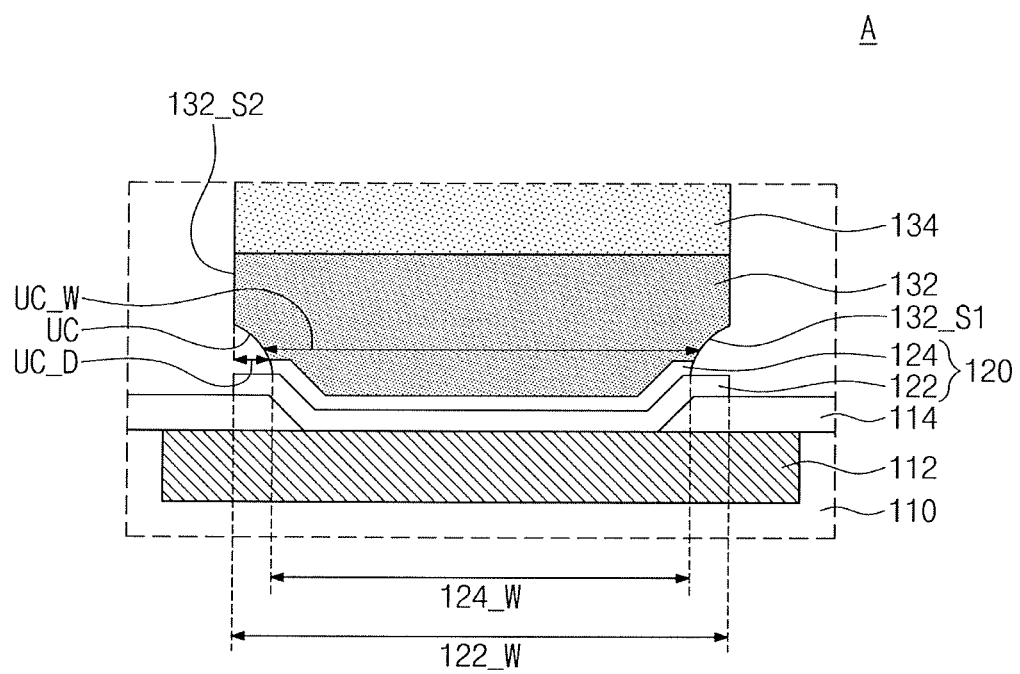
FIG. 1B is an enlarged view of a portion 'A' of FIG. 1A.

FIG. 1A is a sectional view illustrating a portion of a semiconductor device according to an exemplary embodiment of the inventive concept. FIG. 1B is an enlarged view of a portion 'A' of FIG. 1A.

Referring to FIGS. 1A and 1B, a semiconductor device may include an electric connection part 10 disposed on a substrate 110. The substrate 110 may be or include a semiconductor substrate (e.g., a silicon wafer or a germanium wafer). A pad 112 may be disposed on a surface of the substrate 110. An insulating layer 114 may be disposed on the pad 112. The insulating layer 114 may have an opening through which the pad 112 is exposed. The pad 112 may be formed of or include, for example, aluminum. The insulating layer 114 may be formed of or include, for example, silicon oxide, silicon nitride, or silicon oxynitride. At least one of a memory circuit or a logic circuit may be formed on the substrate 110 and electrically connected to the pad 112.

The electric connection part 10 may include a bump structure 130 disposed on the pad 112 and an under-bump pattern 120 disposed between the pad 112 and the bump structure 130. The bump structure 130 may be electrically connected to the pad 112 through the under-bump pattern 120.

The under-bump pattern 120 may be disposed to have a single- or multi-layered structure. In an exemplary embodiment, as shown in FIG. 1B, the under-bump pattern 120 may be a multi-layered structure, in which a barrier pattern 122 and a seed pattern 124 are sequentially stacked. The barrier pattern 122 may prevent or suppress metal atoms in the bump structure 130 from being diffused into the pad 112. For example, the barrier pattern 122 may be formed of or include tantalum, titanium, tantalum nitride, or titanium nitride. The seed pattern 124 may be used as a seed layer in a process of forming a first copper layer 132 and may be formed of or include copper. A width 122_W of the barrier pattern 122 may be greater than a width 124_W of the seed pattern 124. In an exemplary embodiment, the under-bump pattern 120 may be conductive.

The bump structure 130 may include the first copper layer 132, a second copper layer 134, and a solder ball SDB. The first copper layer 132 and the second copper layer 134 may be sequentially stacked on the under-bump pattern 120, and the solder ball SDB may be disposed on the second copper layer 134. In an exemplary embodiment, the first copper layer 132 may be in contact with the second copper layer 134.

The first copper layer 132 may include a first sidewall 132_S1 and a second sidewall 132_S2. The first sidewall 132_S1 and the barrier pattern 122 may define an under-cut region UC. The under-cut region UC may be a region that is laterally and inwardly recessed from the second sidewall 132_S2. The under-cut region UC may be formed adjacent to the under-bump pattern 120. In the case where, as shown in FIGS. 1A and 1B, the first copper layer 132 may have a thickness 132_TH to the extent that the under-cut region UC may be locally formed under the first sidewall 132_S1 of the first copper layer 132. The present inventive concept is not limited thereto. In an exemplary embodiment, the formation of the under-cut region UC may be suppressed because an etch rate of the first copper layer 132 is lower than an etch rate of the second copper layer 134. Unlike that shown in FIGS. 1A and 1B, if the thickness 132_TH of the first copper layer 132 is small, the under-cut region UC may be formed throughout the sidewall of the first copper layer 132.

Referring back to FIG. 1B, a depth UC_D of the under-cut region UC may be laterally measured from an extension line of the second sidewall 132_S2 to the first sidewall 132_S1.

In an exemplary embodiment, the depth UC_D may be upwardly decreased from an upper surface of the barrier pattern 122. For example, the greatest depth of the depth UC_D may range from about 0.2 μm to about 0.6 μm.

In an exemplary embodiment, a width UC_W of the first copper layer 132 may upwardly increase from an upper surface of the seed pattern 124. The width UC_W of the first copper layer 132 which in contact with the under-cut region UC may be smaller than a width of the under-bump pattern 120 (e.g., the width 122_W of the barrier pattern 122).

The thickness 132_TH of the first copper layer 132 may be smaller than a thickness 134_TH of the second copper layer 134. In an exemplary embodiment, the thickness 132_TH of the first copper layer 132 may be smaller than about 0.2 times the thickness 134_TH of the second copper layer 134. For example, the thickness 132_TH of the first copper layer 132 may range from about 0.5 μm to about 3 μm, and the thickness 134_TH of the second copper layer 134 may range from 10 μm to 30 μm.

Each of the first and second copper layers 132 and 134 may have a polycrystalline structure. For example, each of the first and second copper layers 132 and 134 may include a (111) plane and a (200) plane. An X-ray diffraction (XRD) peak intensity ratio of (111) plane to (200) plane in the first copper layer 132 may be greater than an XRD peak intensity ratio of (111) plane to (200) plane in the second copper layer 134. This may be because, as described below, the first copper layer 132 is formed using a pulsed-plating process and the second copper layer 134 is formed using a DC-plating process. In an exemplary embodiment, the XRD peak intensity ratio of (111) plane to (200) plane in the first copper layer 132 may be greater than two times the XRD peak intensity ratio of (111) plane to (200) plane in the second copper layer 134. In an exemplary embodiment, the XRD peak intensity ratio of (111) plane to (200) plane in the first copper layer 132 may be smaller than 100 times the XRD peak intensity ratio of (111) plane to (200) plane in the second copper layer 134. In each copper layer, the XRD peak intensity ratio of (111) plane to (200) plane may be obtained by measuring XRD intensities from (111) and (200) planes of each copper layer and comparing them.

A twin boundary density in the first copper layer 132 may be higher than a twin boundary in the second copper layer 134. The twin boundary density may be defined as an area, a length, or the number of a twin boundary per unit area.

When a wet etching solution is used, copper in the first copper layer 132 may be etched at an etch rate that is lower than an etch rate of copper in the second copper layer 134. This may be because the XRD peak intensity ratio of (111) plane to (200) plane in the first copper layer 132 may be greater than the XRD peak intensity ratio of (111) plane to (200) plane in the second copper layer 134. This may be because the twin boundary density in the first copper layer 132 may be higher than the twin boundary density in the second copper layer 134. In an exemplary embodiment, when a wet etching solution containing hydrogen peroxide ($H_2O_2$) and phosphoric acid ($H_3PO_4$) or a wet etching solution containing hydrogen peroxide ($H_2O_2$) and citric acid ($C_6H_8O_7$) is used to etch the first and second copper layers 132 and 134, a copper etch rate of the first copper layer 132 may be lower than about 0.5 times a copper etch rate of the second copper layer 134. This will be described in more detail with reference to FIGS. 9A and 9B.

The solder ball SDB may be disposed on the second copper layer 134. The solder ball SDB may be formed of or include for example at least one of tin, silver, copper, zinc, lead, or alloys thereof. In an exemplary embodiment, the solder ball SDB may be in contact with the second copper layer 134.

Figure 2:
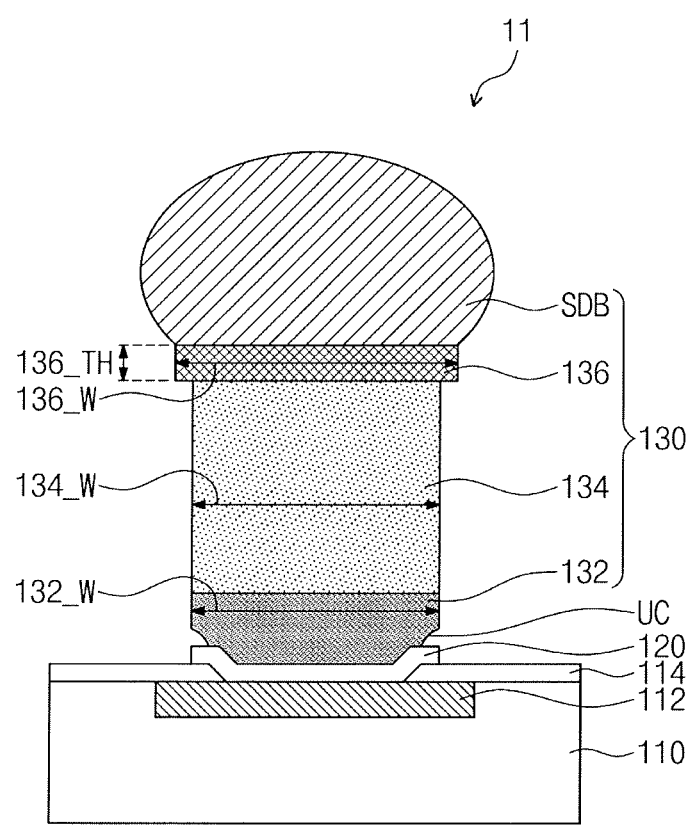
FIGS. 2 and 3 are sectional views illustrating a portion of a semiconductor device according to an exemplary embodiment of the inventive concept.

FIG. 2 is a sectional view illustrating a portion of a semiconductor device according to an exemplary embodiment of the inventive concept.

Referring to FIG. 2, a semiconductor device may include an electric connection part 11 disposed on a substrate 110. For concise description, an element previously described with reference to FIGS. 1A and 1B may be identified by a similar or identical reference number without repeating a duplicating description thereof. Hence, the following description focuses on the bump structure 130.

The bump structure 130 may include the first copper layer 132, the second copper layer 134, the solder ball SDB, and a nickel layer 136. The first copper layer 132, the second copper layer 134, and the solder ball SDB may have the same as those described with reference to FIGS. 1A and 1B.

The nickel layer 136 may be disposed between the second copper layer 134 and the solder ball SDB. A thickness 136_TH of the nickel layer 136 may be smaller than a thickness (e.g., 134_TH of FIG. 1A) of the second copper layer 134. For example, the thickness 136_TH of the nickel layer 136 may be about 3 µm. A width 136_W of the nickel layer 136 may be greater than a width 132_W of the first copper layer 132 and a width 134_W of the second copper layer 134. In an exemplary embodiment, the nickel layer 136, the first copper layer 132 and the second copper layer 134 may be substantially concentric.

Figure 3:
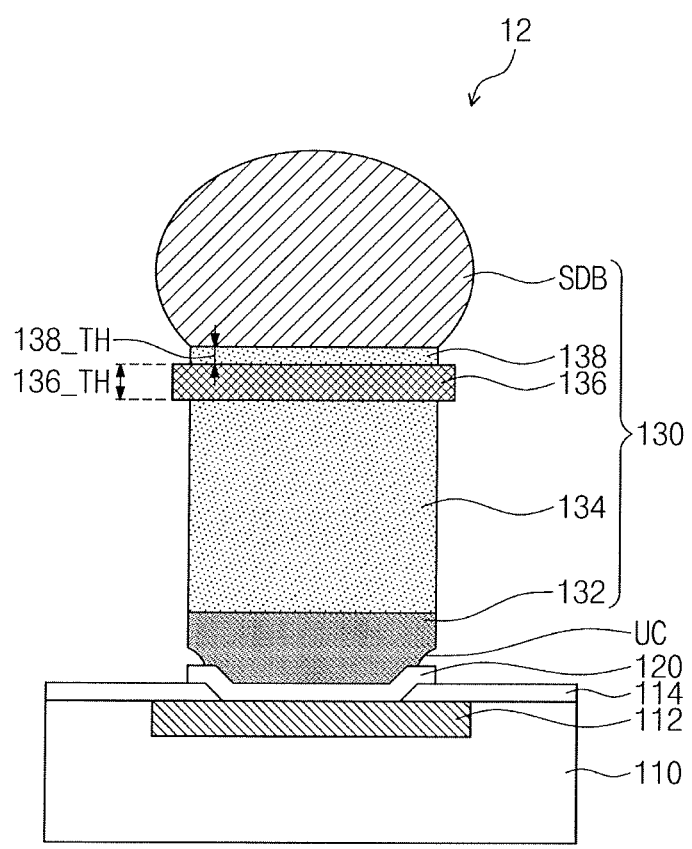

FIG. 3 is a sectional view illustrating a portion of a semiconductor device according to an exemplary embodiment of the inventive concept.

Referring to FIG. 3, a semiconductor device may include an electric connection part 12 disposed on a substrate 110. For concise description, an element previously described with reference to FIGS. 1A, 1B, and 2 may be identified by a similar or identical reference number without repeating a duplicating description thereof. The following description focuses on the bump structure 130.

The bump structure 130 may include the first copper layer 132, the second copper layer 134, the nickel layer 136, the solder ball SDB, and a third copper layer 138. The first copper layer 132, the second copper layer 134, the nickel layer 136, and the solder ball SDB may be configured to have the same as those described with reference to FIGS. 1A, 1B, and 2.

The third copper layer 138 may be disposed between the nickel layer 136 and the solder ball SDB. A thickness 138_TH of the third copper layer 138 may be smaller than the thickness 136_TH of the nickel layer 136. For example, the thickness 138_TH of the third copper layer 138 may be less than 1 µm.

The third copper layer 138 may be disposed to have material characteristics similar to those of the second copper layer 134. An XRD peak intensity ratio of (111) plane to (200) plane in the third copper layer 138 may be smaller than an XRD peak intensity ratio of (111) plane to (200) plane in the first copper layer 132. In an exemplary embodiment, the XRD peak intensity ratio of (111) plane to (200) plane in the third copper layer 138 may be smaller than about 0.5 times the XRD peak intensity ratio of (111) plane to (200) plane in the first copper layer 132. A twin boundary density in the third copper layer 138 may be smaller than a twin boundary density in the first copper layer 132.

When a wet etching solution is used, a copper etch rate of the third copper layer 138 may be higher than a copper etch rate of the first copper layer 132. This may be because the XRD peak intensity ratio of (111) plane to (200) plane in the third copper layer 138 may be smaller than the XRD peak intensity in the first copper layer 132. This is because the twin boundary density in the third copper layer 138 may be smaller than the twin boundary density in the first copper layer 132. In an exemplary embodiment, when a wet etching solution containing hydrogen peroxide ($H_2O_2$) and phosphoric acid ($H_3PO_4$) or a wet etching solution containing hydrogen peroxide ($H_2O_2$) and citric acid ($C_6H_8O_7$) is used to etch the third and first copper layers 138 and 132, a copper etch rate of the third copper layer 138 may be higher than two times a copper etch rate of the first copper layer 132.

Figure 4A:
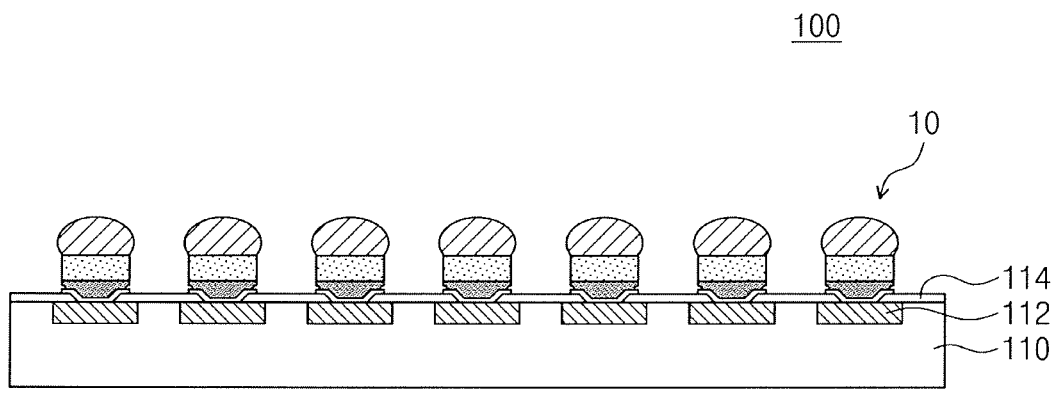
FIG. 4A is a sectional view illustrating a semiconductor device according to an exemplary embodiment of the inventive concept.

FIG. 4A is a sectional view illustrating a semiconductor device according to an exemplary embodiment of the inventive concept.

Referring to FIG. 4A, a semiconductor device 100 may include a substrate 110 and electric connection parts 10.

The substrate 110 may include a plurality of pads 112, which are disposed on a surface thereof, and an insulating layer 114, which is patterned to expose the pads 112. In an exemplary embodiment, the pads 112 may be uniformly disposed on the entire top surface of the substrate 110, as shown in FIG. 4A. In certain embodiments, the pads 112 may be disposed on an edge or center region of the substrate 110, unlike that shown in FIG. 4A. At least one of a memory circuit or a logic circuit may be formed on the substrate 110 and may be electrically connected to the pad 112. In an exemplary embodiment, the pads 112 may be buried in the substrate so that upper surfaces of the pads 112 are substantially coplanar with an upper surface of the substrate 110.

The electric connection parts 10 may be disposed on the pads 112, respectively. Each of the electric connection parts 10 may include a bump structure disposed on the pad 112 and an under-bump pattern disposed between the pad 112 and the bump structure. In an exemplary embodiment, as shown in FIG. 4A, each of the electric connection parts 10 may be the same as the electric connection parts 10 of FIGS. 1A and 1B. In an exemplary embodiment, each of the electric connection parts 10 may be the same as the electric connection part 11 of FIG. 2 or the electric connection part 12 of FIG. 3.

Figure 4B:
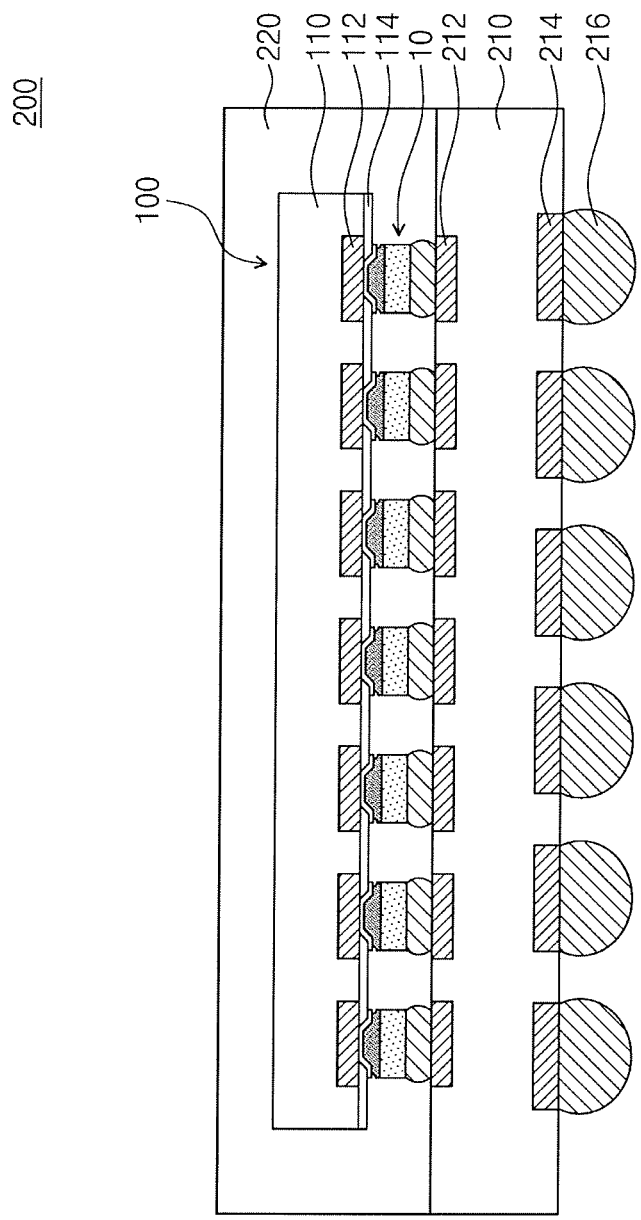
FIGS. 4B and 4C are sectional views illustrating a semiconductor package according to an exemplary embodiment of the inventive concept.

FIG. 4B is a sectional view illustrating a semiconductor package according to an exemplary embodiment of the inventive concept.

Referring to FIG. 4B, a semiconductor package 200 may include a package substrate 210 and a semiconductor device 100 mounted on the package substrate 210. The semiconductor device 100 may be the same as that described with reference to FIG. 4A.

The package substrate 210 may include connection pads 212, which are disposed on a top surface thereof, and outer pads 214, which are disposed on a bottom surface thereof. Outer terminals 216 may be disposed on the outer pads 214.

The semiconductor device 100 may be mounted on the package substrate 210 in a flip-chip bonding manner. The semiconductor device 100 may be aligned in such a way that the electric connection parts 10 face the top surface of the package substrate 210, and the electric connection parts 10 may be coupled to the connection pads 212. For example, a soldering process may be performed to solder the solder ball (e.g., SDB in FIG. 1A) in each of the electric connection parts 10 on the connection pad 212, and thus, the semiconductor device 100 may be mounted on the package substrate 210. For example, the solder ball SDB may be attached to the connection pad 212 using the soldering process.

Each of the electric connection parts 10 may be the same as the electric connection part 11 of FIG. 2 or the electric connection part 12 of FIG. 3.

A mold layer 220 may be disposed on the top surface of the package substrate 210 to cover the semiconductor device 100. For example, the mold layer 220 may be formed of or include an epoxy molding compound. In an exemplary embodiment, an under-fill layer (not shown) may be further disposed between the semiconductor device 100 and the package substrate 210.

Figure 4C:
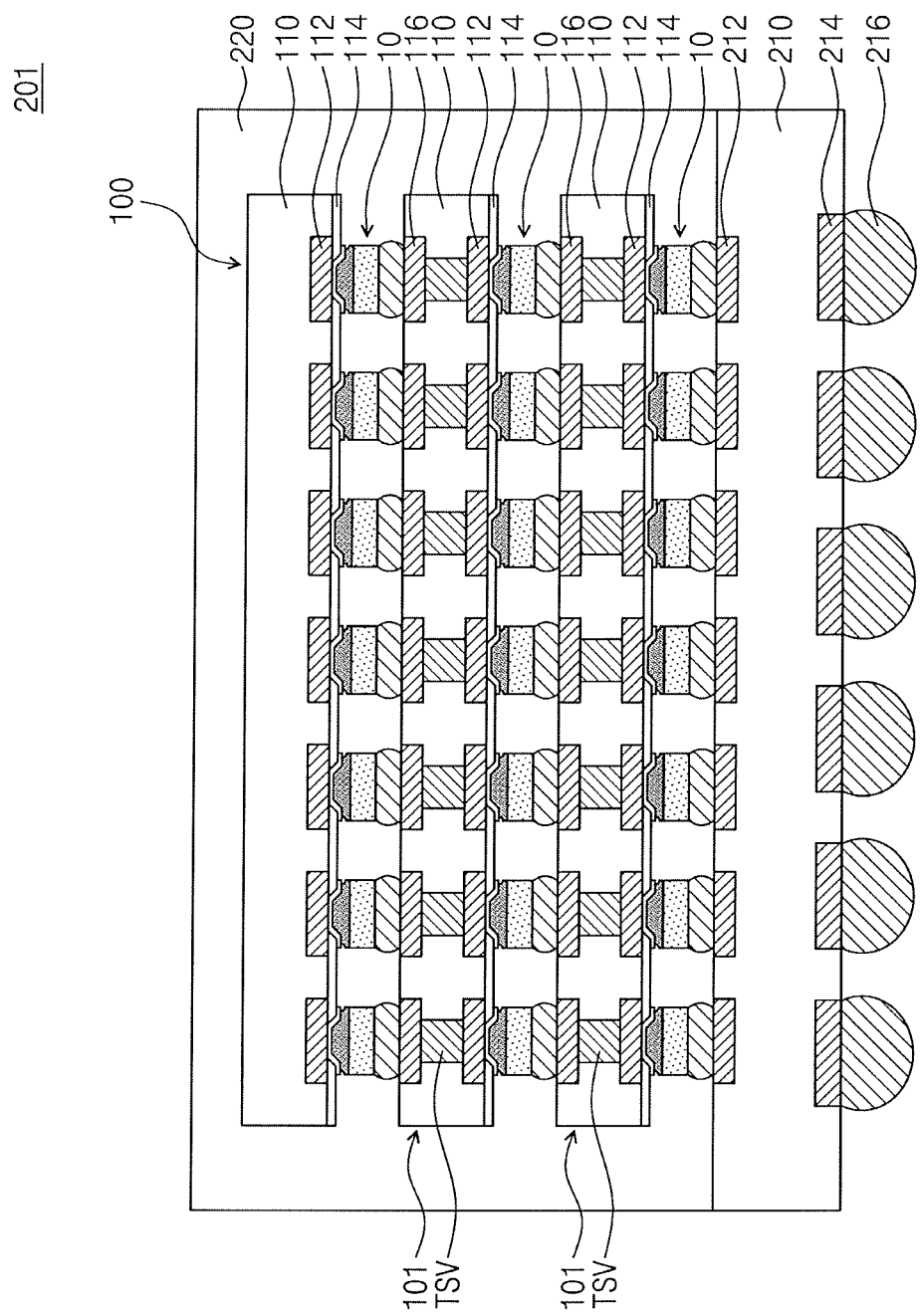

FIG. 4C is a sectional view illustrating a semiconductor package according to an exemplary embodiment of the inventive concept.

Referring to FIG. 4C, a semiconductor package 201 may include a package substrate 210 and semiconductor devices 100 and 101 mounted thereon.

The package substrate 210 may be the same as that described with reference to FIG. 4B. A detailed description of the package substrate 210 will be omitted.

The semiconductor devices 100 and 101 may be mounted on the top surface of the package substrate 210. For example, the first semiconductor device 100 may be disposed on the top surface of the package substrate 210, and the second semiconductor devices 101 may be disposed between the first semiconductor device 100 and the package substrate 210. The first semiconductor device 100 may be substantially the same as the semiconductor device 100 described with reference to FIG. 4A. Each of the second semiconductor devices 101 may further include through electrodes TSV, which penetrate the substrate 110, and additional pads 116, which face the pads 112 and are connected to the through electrodes TSV, and except for these, it may be the same as the semiconductor device 100 described with reference to FIG. 4A.

The first semiconductor device 100 may be electrically connected to the second semiconductor device 101 therebelow. For example, the electric connection parts 10 of the first semiconductor device 100 may be coupled to the additional pads 116 of the second semiconductor device 101 therebelow.

Each of the second semiconductor devices 101 may be electrically connected to the second semiconductor device 101 therebelow or the package substrate 210. For example, the electric connection parts 10 of the lowermost one of the second semiconductor devices 101 may be coupled to the connection pads 212 of the package substrate 210, and the electric connection parts 10 of the others of the second semiconductor devices 101 may be coupled to the additional pads 116 of the second semiconductor device 101 therebelow.

Each of the electric connection parts 10 may be substantially the same as the electric connection part 11 of FIG. 2 or the electric connection part 12 of FIG. 3.

A mold layer 220 may be disposed on the top surface of the package substrate 210 to cover the semiconductor devices 100 and 101. In an exemplary embodiment, underfill layers (not shown) may be further disposed between the semiconductor devices 100 and 101 and between the lowermost one of the second semiconductor devices 101 and the package substrate 210.

FIGS. 5A to 5D are sectional views illustrating a method of fabricating a semiconductor device, according to an exemplary embodiment of the inventive concept. FIG. 5E is an enlarged view of a portion 'B' of FIG. 5A. FIG. 6A is a graph showing a current density over time, in a pulsed-plating process for forming a first copper layer. FIG. 6B is a graph showing a current density over time, in a DC plating process for forming a second copper layer.

Figure 5A:
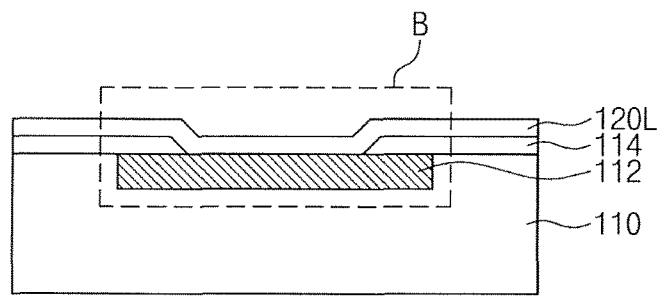
FIGS. 5A to 5D are sectional views illustrating a method of fabricating a semiconductor device, according to an exemplary embodiment of the inventive concept.
Figure 6A:
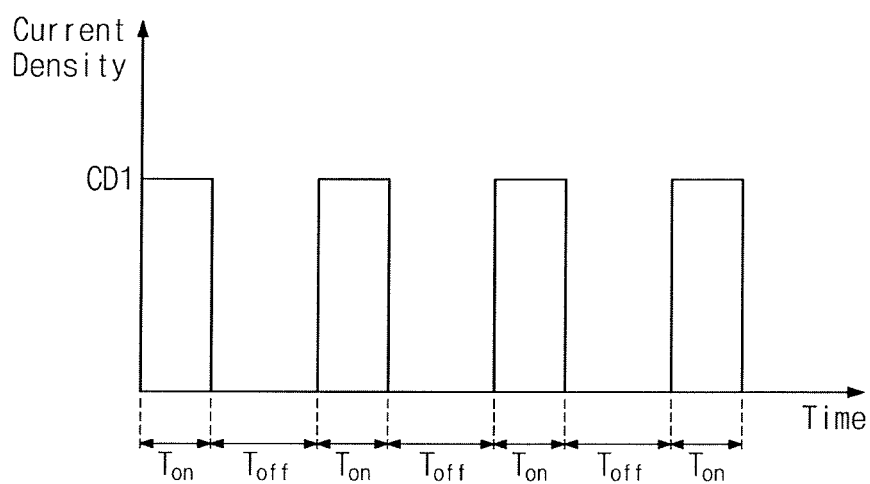
FIG. 6A is a graph showing a current density over time, in a pulsed-plating process for forming a first copper layer.
Figure 6B:
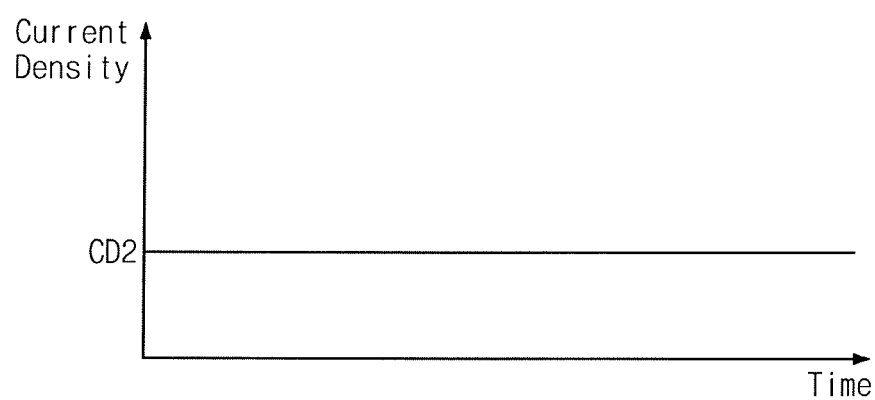
FIG. 6B is a graph showing a current density over time, in a DC plating process for forming a second copper layer.

Referring to FIG. 5A, a substrate 110 may be provided. The substrate 110 may be or include a semiconductor substrate (e.g., a silicon wafer or a germanium wafer). The substrate 110 may include a pad 112, which is disposed on a surface thereof, and an insulating layer 114, which is patterned to expose the pad 112. At least one of a memory circuit or a logic circuit may be formed on the substrate 110 and may be electrically connected to the pad 112.

An under-bump layer 120L may be formed on the surface of the substrate 110. The under-bump layer 120L may be formed to cover the pad 112 exposed by the insulating layer 114 and to be extended to cover the insulating layer 114. In an exemplary embodiment, as shown in FIG. 5E, the formation of the under-bump layer 120L may include sequentially depositing a barrier layer 122L and a seed layer 124L. For example, the barrier layer 122L may be formed of or include tantalum, titanium, tantalum nitride, or titanium nitride, and the seed layer 124L may be formed of or include copper. The under-bump layer 120L may be formed using, for example, a physical vapor deposition (PVD) process.

Figure 5B:
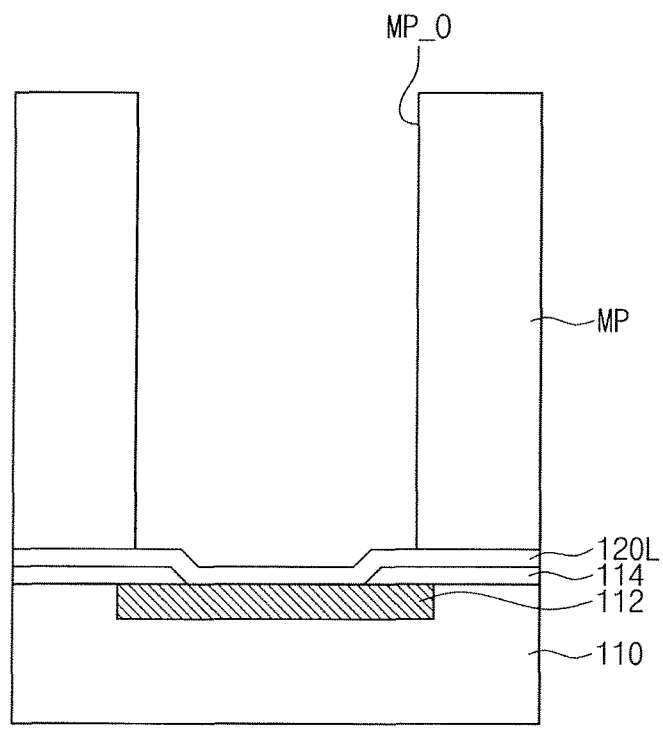

Referring to FIG. 5B, a mask pattern MP with an opening MP_O may be formed on the under-bump layer 120L. When viewed in a plan view, the opening MP_O may be overlapped with the pad 112 and may be formed to expose the under-bump layer 120L. In an exemplary embodiment, the formation of the mask pattern MP may include coating a photoresist layer (not shown) and patterning the photoresist layer using a photolithography process.

Figure 5C:
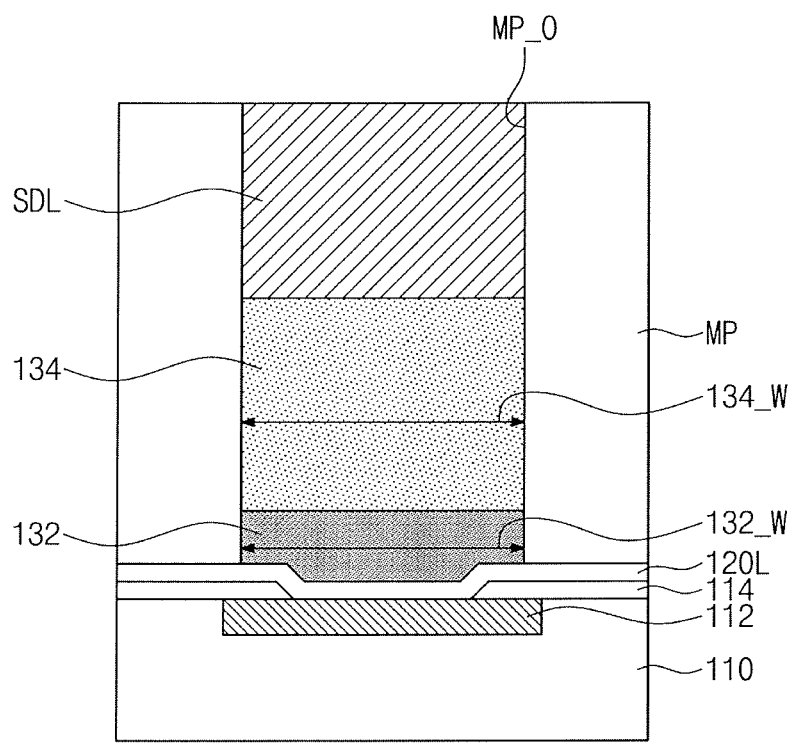

Referring to FIG. 5C, a first copper layer 132, a second copper layer 134, and a solder layer SDL may be sequentially formed in the opening MP_O.

Referring to FIGS. 5C and 6A, the first copper layer 132 may be formed on the under-bump layer 120L. The first copper layer 132 may be formed using a pulsed-plating process. For example, the first copper layer 132 may be formed by a plating process using a pulsed current, as shown in FIG. 6A. The seed layer 124L may be used as a seed in the pulsed-plating process. The pulsed-plating process may include a plurality of turn-on stages, in which a current is supplied to the plating system, and a plurality of turn-off stages, in which a current is interrupted, and the turn-on and turn-off stages may be alternatingly and repeatedly performed in the pulsed-plating process. A duty cycle of the pulsed-plating process may range from about 5% to about 50%. Here, referring to FIG. 6A, the duty cycle may be given by an equation of $(T_{on})/(T_{on}+T_{off})$, where $T_{on}$ is a duration time of the turn-on stage and $T_{off}$ is a duration time of the turn-off stage. During the turn-on stage of the pulsed-plating process, the supplied current may have a first current density CD1. A thickness of the first copper layer 132 may be greater than a depth of an under-cut region UC to be described with reference to FIG. 5D. Also, the thickness of the first copper layer 132 may be smaller than about 0.2 times a thickness of the second copper layer 134 to be described below. In an exemplary embodiment, the first copper layer 132 may be formed to have a thickness of about 0.5 μm to about 3 μm.

Referring to FIGS. 5C and 6B, the second copper layer 134 may be formed on the first copper layer 132. The second copper layer 134 may be formed using a DC plating process. For example, the second copper layer 134 may be formed by a plating process using a DC current, as shown in FIG. 6B. For example, a DC current of a second current density CD2 may be supplied to form the second copper layer 134. In an exemplary embodiment, the second current density CD2 may be smaller than the first current density CD1. For example, the second current density CD2 may range from about 5% to about 50%, relative to the first current density CD1. In an exemplary embodiment, the second current density CD2 in the DC plating process for forming the second copper layer 134 may be substantially the same as a mean current density (i.e., $(CD1*T_{on})/(T_{on}+T_{off})$) in the pulsed-plating process for forming the first copper layer 132.

The second copper layer 134 may be formed to have a thickness larger than that of the first copper layer 132. For example, the second copper layer 134 may be formed to have a thickness of 10 μm to 30 μm.

As described above, the first copper layer 132 may be formed using the pulsed-plating process, whereas the second copper layer 134 may be formed using the DC plating process. This may allow for the first copper layer 132 to have a higher XRD peak intensity ratio of (111) plane to (200) plane and a higher twin boundary density, compared with those of the second copper layer 134. Also, this may allow for the first copper layer 132 to have corrosion resistance that is higher than corrosion resistance of the second copper layer 134. For example, in the case where an etching process is performed using a wet etching solution containing hydrogen peroxide ($H_2O_2$) and phosphoric acid ($H_3PO_4$) or a wet etching solution containing hydrogen peroxide ($H_2O_2$) and citric acid ($C_6H_8O_7$), a copper etch rate of the first copper layer 132 may be lower than about 0.5 times a copper etch rate of the second copper layer 134. A growth rate (per unit time) of the first copper layer 132 may be smaller than a growth rate of the second copper layer 134.

Referring to FIG. 5C, the solder layer SDL may be formed on the second copper layer 134. The solder layer SDL may be formed using a DC plating process. In an exemplary embodiment, the plating processes for forming the first copper layer 132, the second copper layer 134, and the solder layer SDL may be performed in an in-situ manner. The inventive concept is not limited thereto. The solder layer SDL may be formed of or include, for example, tin, silver, copper, zinc, lead, or alloys thereof.

Figure 5D:
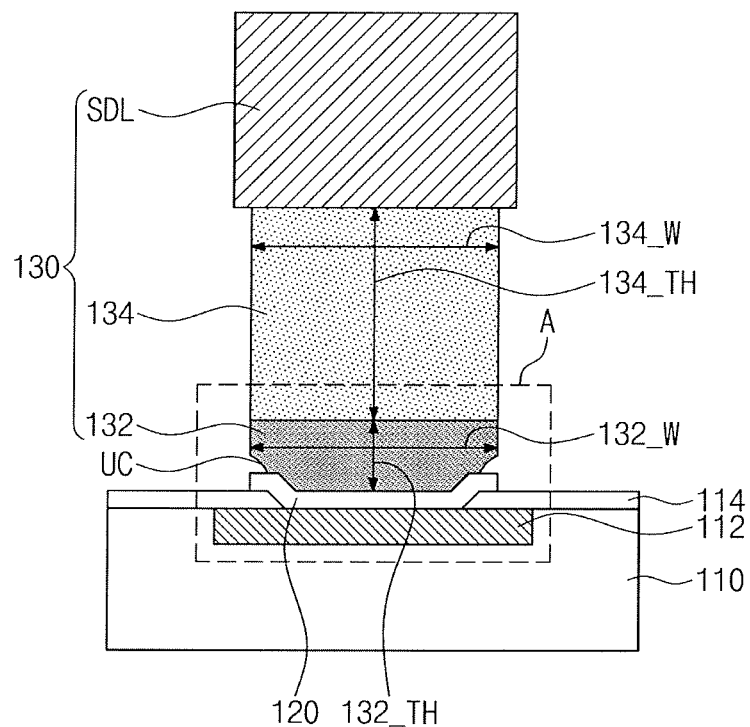
Figure 5E:
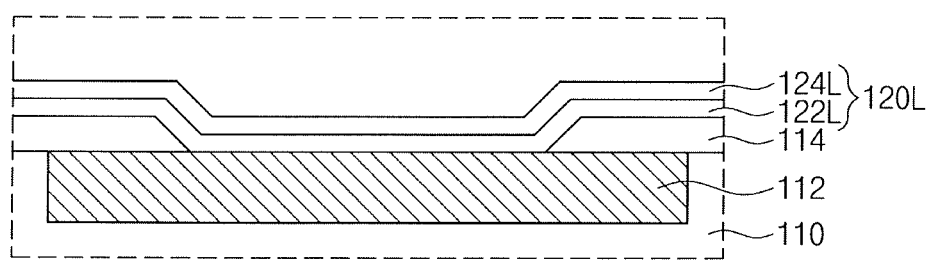
FIG. 5E is an enlarged view of a portion 'B' of FIG. 5A.

Referring to FIG. 5D, the mask pattern MP may be removed. As a result of the removal of the mask pattern MP, the under-bump layer 120L, the first copper layer 132, and the second copper layer 134 may be exposed. The removal of the mask pattern MP may be performed using a strip process.

Referring to FIGS. 5D and 1B, the under-bump layer 120L may be etched to form an under-bump pattern 120. The formation of the under-bump pattern 120 may include performing a wet etching process on the under-bump layer 120L. In the wet etching process, an etch rate of the seed layer 124L may be greater than an etch rate of the barrier layer 122L due to a Galvanic corrosion effect. Accordingly, a width 122_W of a barrier pattern 122 may be greater than a width 124_W of a seed pattern 124. The wet etching process may be performed using, for example, a wet etching solution containing hydrogen peroxide ($H_2O_2$) and phosphoric acid ($H_3PO_4$) or a wet etching solution containing hydrogen peroxide ($H_2O_2$) and citric acid ($C_6H_8O_7$).

The first copper layer 132 and the second copper layer 134 may be partially etched during the wet etching process. Accordingly, the width 132_W of the first copper layer 132 and the width 134_W of the second copper layer 134 may be decreased.

As described above, the first copper layer 132 may have the corrosion resistance higher than corrosion resistance of the second copper layer 134. Nevertheless, due to the Galvanic corrosion effect, a portion (e.g., lower portion) of the first copper layer 132 adjacent to the under-bump layer 120L (or the under-bump pattern 120) may exhibit an etch rate higher than an etch rate of the second copper layer 134, during the wet etching process. Thus, the under-cut region UC may be formed on a sidewall of the first copper layer 132. As shown in FIGS. 5D and 1B, a thickness 132_TH of the first copper layer 132 is sufficiently large to the extent that the under-cut region UC may be locally formed in a lower sidewall of the first copper layer 132. By contrast, unlike that shown in FIGS. 5D and 1B, the under-cut region UC may be formed throughout the sidewall of the first copper layer 132, if the thickness 132_TH of the first copper layer 132 is thin. A depth UC_D of the under-cut region UC may be laterally measured from the un-recessed side surfaces of the first and second copper layers 132 and 134. In an exemplary embodiment, the depth UC_D of the under-cut region UC may range from about 0.2 μm to about 0.6 μm. A portion of the first copper layer 132 at the same level as the under-cut region UC may have a width UC_W that is smaller than the width 122_W of the barrier pattern 122.

Referring to FIG. 1A, a reflow process may be performed on the solder layer SDL, and as a result, a solder ball SDB may be formed. During the reflow process, some of copper atoms in the second copper layer 134 may be diffused into the solder ball SDB.

In the case where a copper layer is formed on an under-bump layer, an under-cut region may be formed in a lower portion of the copper layer, due to the Galvanic corrosion effect in a subsequent wet process. The under-cut region may result in failures of a semiconductor device, and thus, it may be necessary to reduce a size (e.g., a depth) of the under-cut region.

According to an exemplary embodiment of the inventive concept, the first copper layer 132 adjacent to the under-bump layer 120L may be formed using a pulsed-plating process, and this may allow for the first copper layer 132 to have higher corrosion resistance than the other copper layers stacked on the first copper layer 132 (for example, the second copper layer 134). The other copper layers may be formed using a DC-plating process. Furthermore, the first copper layer 132 may be formed to have a thickness greater than the depth UC_D of the under-cut region UC. Accordingly, it is possible to reduce a size of the under-cut region UC that may be formed in a portion of the copper layer adjacent to the under-bump layer 120L. According to an exemplary embodiment of the inventive concept, a semiconductor device can be fabricated to have increased reliability.

A growth rate of a copper layer may be lower when the pulsed-plating process is used than when the DC plating process is used.

According to an exemplary embodiment of the inventive concept, the rest portion (i.e., the second copper layer 134) of the copper layer, other than the first copper layer 132, may be formed using the DC plating process. For example, the thickness 132_TH of the first copper layer 132 may be smaller than about 0.2 times the thickness 134_TH of the second copper layer 134. Thus, it may reduce an increase of a total process time due to the introduction of the pulsed-plating process.

Figure 7A:
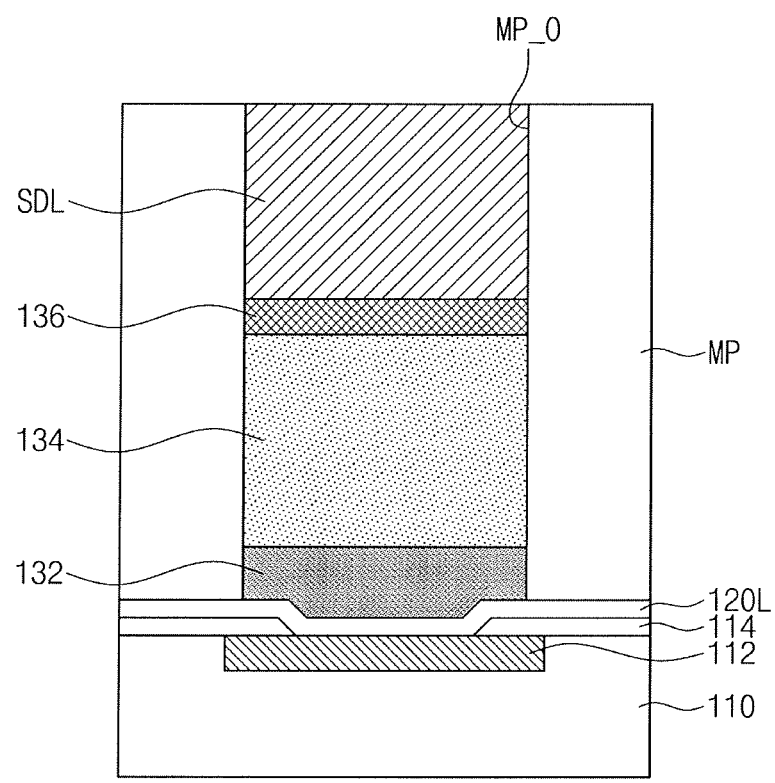
FIGS. 7A to 7B are sectional views illustrating a method of fabricating a semiconductor device, according to an exemplary embodiment of the inventive concept.
Figure 7B:
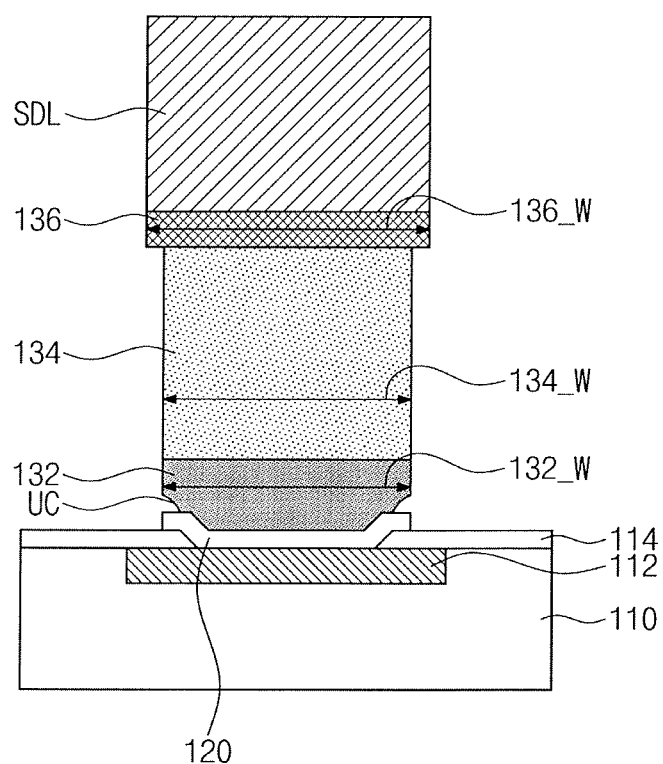

FIGS. 7A to 7B are sectional views illustrating a method of fabricating a semiconductor device, according to an exemplary embodiment of the inventive concept. Processes to be described with reference to FIGS. 7A and 7B may be performed on the resulting structure of FIG. 5B.

Referring to FIG. 7A, a first copper layer 132, a second copper layer 134, a nickel layer 136, and a solder layer SDL may be sequentially formed in the opening MP_O. The first and second copper layers 132 and 134 may be formed by the same method as that described with reference to FIGS. 5C, 6A, and 6B, and a detailed description thereof will be omitted.

The nickel layer 136 may be formed on the second copper layer 134. The nickel layer 136 may be formed using a DC plating process. The nickel layer 136 may be formed to have a thickness of, for example, about 3 μm.

The solder layer SDL may be formed on the nickel layer 136. The solder layer SDL may be formed using a DC plating process. In an exemplary embodiment, the plating processes for forming the first copper layer 132, the second copper layer 134, the nickel layer 136, and the solder layer SDL may be performed in an in-situ manner. But the present inventive concept is not limited thereto.

Referring to FIG. 7B, the mask pattern MP may be removed. As a result of the removal of the mask pattern MP, the under-bump layer 120L, the first copper layer 132, the second copper layer 134, and the nickel layer 136 may be exposed. The removal of the mask pattern MP may be performed using a strip process.

The under-bump layer 120L may be etched to form an under-bump pattern 120. The formation of the under-bump pattern 120 may include performing a wet etching process on the under-bump layer 120L. The wet etching process may be performed to partially etch the under-bump layer 120L, the first copper layer 132, and the second copper layer 134, as described with reference to FIGS. 5D and 1B.

In the wet etching process, an etch rate of the nickel layer 136 may be smaller than an etch rate of the first copper layer 132 and an etch rate of the second copper layer 134. Accordingly, after the wet etching process, a width 136_W of the nickel layer 136 may be greater than the width 132_W of the first copper layer 132 and the width 134_W of the second copper layer 134, as shown in FIG. 7B.

Referring back to FIG. 2, a reflow process may be performed on the solder layer SDL, and as a result, a solder ball SDB may be formed.

Figure 8A:
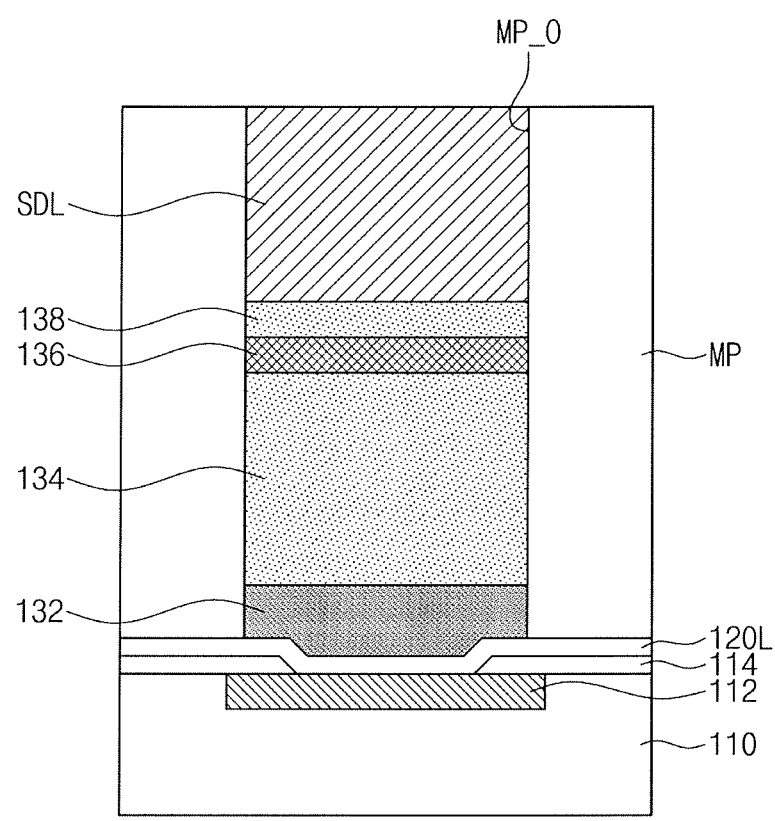
FIGS. 8A to 8B are sectional views illustrating a method of fabricating a semiconductor device, according to an exemplary embodiment of the inventive concept.
Figure 8B:
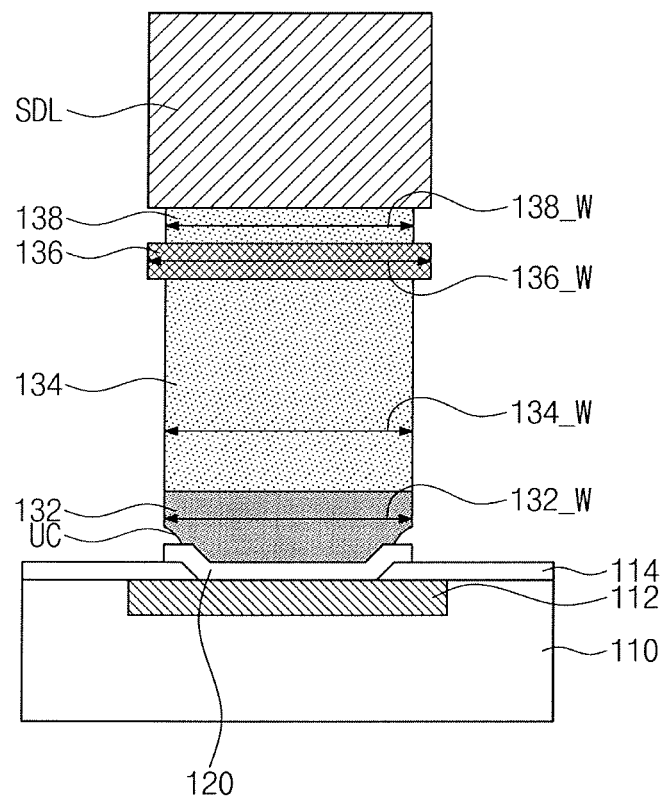

FIGS. 8A to 8B are sectional views illustrating a method of fabricating a semiconductor device, according to an exemplary embodiment of the inventive concept. Processes to be described with reference to FIGS. 8A and 8B may be performed on the resulting structure of FIG. 5B.

Referring to FIG. 8A, a first copper layer 132, a second copper layer 134, a nickel layer 136, a third copper layer 138, and a solder layer SDL may be sequentially formed in the opening MP_O. The first copper layer 132, the second copper layer 134, and the nickel layer 136 may be formed by the same method as that described with reference to FIG. 7A, and a detailed description thereof will be omitted.

The third copper layer 138 may be formed on the nickel layer 136. The third copper layer 138 may be formed using a DC plating process. The third copper layer 138 may be formed to have a thickness of, for example, about 2 μm.

The solder layer SDL may be formed on the third copper layer 138. The solder layer SDL may be formed using a DC plating process. In an exemplary embodiment, the plating processes for forming the first copper layer 132, the second copper layer 134, the nickel layer 136, the third copper layer 138, and the solder layer SDL may be performed in an in-situ manner. But the present inventive concept is not limited thereto.

Referring to FIG. 8B, the mask pattern MP may be removed. As a result of the removal of the mask pattern MP, the under-bump layer 120L, the first copper layer 132, the second copper layer 134, the nickel layer 136, and the third copper layer 138 may be exposed.

The under-bump layer 120L may be etched to form an under-bump pattern 120. The formation of the under-bump pattern 120 may include performing a wet etching process on the under-bump layer 120L. The wet etching process may be performed to partially etch the under-bump layer 120L, the first copper layer 132, and the second copper layer 134, as described with reference to FIGS. 5D and 1B. In addition, the wet etching process may be performed to partially etch the third copper layer 138.

In the wet etching process, an etch rate of the nickel layer 136 may be smaller than etch rates of the first to third copper layer 132, 134, and 138. Accordingly, after the wet etching process, the width 136_W of the nickel layer 136 may be greater than the width 132_W of the first copper layer 132, the width 134_W of the second copper layer 134, and a width 138_W of the third copper layer 138.

After the wet etching process, a reflow process may be performed on the solder layer SDL, and as a result, a solder ball SDB may be formed. During the reflow process, at least a portion of copper atoms contained in the third copper layer 138 may be diffused into the solder ball SDB.

In an exemplary embodiment, most of the copper atoms contained in the third copper layer 138 may be diffused into the solder ball SDB. In this case, as shown in FIG. 2, the third copper layer 138 need not remain on the nickel layer 136, after the reflow process.

In an exemplary embodiment, only a fraction of copper atoms contained in the third copper layer 138 may be diffused into the solder ball SDB. In this case, as shown in FIG. 3, the third copper layer 138 may remain on the nickel layer 136, after the reflow process.

Figure 9A:
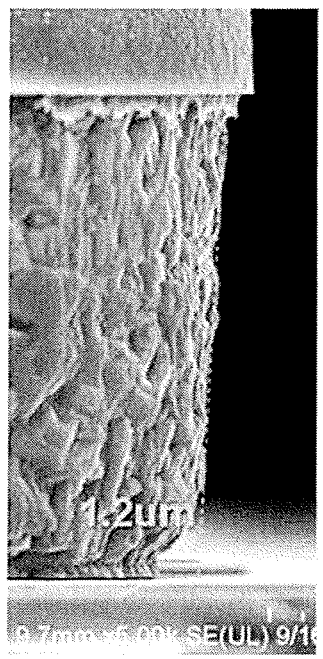
FIG. 9A is an image showing an under-cut region of a copper layer formed by a conventional process.

FIG. 9A is an image showing an under-cut region of a copper layer formed by a conventional process. For example, a DC plating process was performed to form a copper layer and a nickel layer on an under-bump layer. Thereafter, a wet etching process was performed for one minute using an etching solution containing hydrogen peroxide and phosphoric acid. As a result, an under-cut region was formed to have a depth of about 1.2 μm, as shown in FIG. 9A.

Figure 9B:
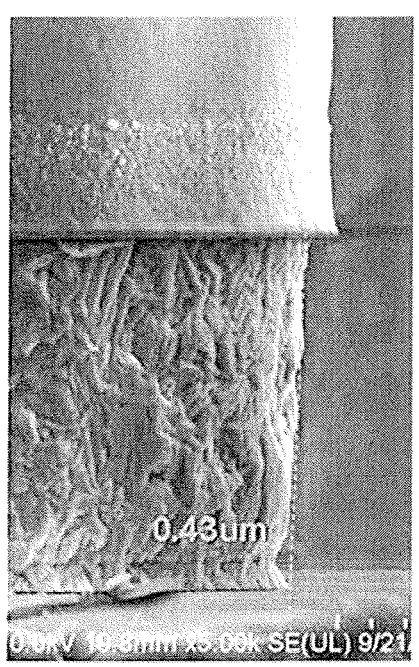
FIG. 9B is an image showing an under-cut region of a copper layer formed by the method according to an exemplary embodiment of the inventive concept.

FIG. 9B is an image showing an under-cut region of a copper layer formed by the method according to an exemplary embodiment of the inventive concept. For example, a pulsed-plating process was performed to form a first copper layer on an under-bump layer, and then, a DC plating process was performed to form a second copper layer and a nickel layer. A duty cycle in the pulsed-plating process was about 10%. Thereafter, a wet etching process was performed for one minute using an etching solution containing hydrogen peroxide and phosphoric acid. As a result, an under-cut region was formed to have a depth of about 0.43 μm, as shown in FIG. 9B.

This shows that a size of the under-cut region UC formed at a lower portion of a copper layer may be reduced by using the method according to an exemplary embodiment of the inventive concept.

According to an exemplary embodiment of the inventive concept, a lower portion of a copper layer adjacent to an under-bump layer may be formed using a pulsed-plating process, allowing the lower portion of the copper layer to have higher corrosion resistance than a copper layer formed using a DC-plating process. Accordingly, a size of an under-cut region is reduced or suppressed, the under-cut region being formed in the lower portion of the copper layer adjacent to the under-bump layer.

According to an exemplary embodiment of the inventive concept, the other copper layer stacked on the first copper layer adjacent to the under-bump layer may be formed using a DC-plating process. This may make it possible to lessen an increase of a total process time due to the introduction of the pulsed-plating process.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
a pad disposed on a substrate; and
a bump structure disposed on the pad and electrically connected to the pad,
wherein the bump structure comprises:
a first copper layer and a second copper layer sequentially stacked on the pad; and
a solder ball on the second copper layer,
wherein a first X-ray diffraction (XRD) peak intensity ratio of (111) plane to (200) plane of the first copper layer is greater than a second XRD peak intensity ratio of (111) plane to (200) plane of the second copper layer, and
wherein a thickness of the first copper layer is greater than a depth of an under-cut region formed on a sidewall of the first copper layer.

2. The semiconductor device of claim 1,
wherein a twin boundary density in the first copper layer is greater than a twin boundary density in the second copper layer.

3. The semiconductor device of claim 1,
wherein a thickness of the first copper layer is smaller than about 0.2 times a thickness of the second copper layer.

4. The semiconductor device of claim 1,
wherein the first copper layer has a thickness ranging from about 0.5 μm to about 3 μm.

5. The semiconductor device of claim 1,
wherein, when an etching solution containing hydrogen peroxide and phosphoric acid or an etching solution containing hydrogen peroxide and citric acid is used, a copper etch rate of the first copper layer is lower than half a copper etch rate of the second copper layer.

6. The semiconductor device of claim 1, wherein a depth of the under-cut region ranges from about 0.2 μm to about 0.6 μm.

7. The semiconductor device of claim 1, further comprising:
an under-bump pattern between the pad and the first copper layer,
wherein a portion of the first copper layer at the same level as the under-cut region has a width that is smaller than that of the under-bump pattern.

8. The semiconductor device of claim 7,
wherein the under-bump pattern comprises:
a barrier pattern and a seed pattern that are sequentially stacked, and
wherein a width of the seed pattern is smaller than a width of the barrier pattern.

9. The semiconductor device of claim 1,
wherein the bump structure further comprises:
a nickel layer interposed between the second copper layer and the solder ball, and
wherein a width of the nickel layer is greater than a width of the first copper layer and a width of the second copper layer.

10. The semiconductor device of claim 9,
wherein the bump structure further comprises:
a third copper layer interposed between the nickel layer and the solder ball, and
wherein the first XRD peak intensity ratio of (111) plane to (200) plane of the first copper layer is greater than a third XRD peak intensity ratio of (111) plane to (200) plane of the third copper layer.

11. A semiconductor device, comprising:
a pad disposed on a substrate; and
a bump structure disposed on the pad and electrically connected to the pad,
wherein the bump structure comprises:
a first copper layer and a second copper layer sequentially stacked on the pad; and
a solder ball on the second copper layer, and
wherein a twin boundary density in the first copper layer is greater than a twin boundary density in the second copper layer, and a thickness of the first copper layer is smaller than about 0.2 times a thickness of the second copper layer.

12. The semiconductor device of claim 11,
wherein the thickness of the first copper layer ranges from about 0.5 to about 3 μm.

13. The semiconductor device of claim 11, further comprising:
an under-cut region formed on a sidewall of the first copper layer, and
wherein a depth of the under-cut region ranges from about 0.2 μm to about 0.5 μm.

14. The semiconductor device of claim 11,
wherein a first X-ray diffraction (XRD) peak intensity ratio of (111) plane to (200) plane of the first copper layer is greater than a second XRD peak intensity ratio of (111) plane to (200) plane of the second copper layer.

15. The semiconductor device of claim 14,
wherein the first XRD peak intensity ratio of the first copper layer is greater than two times the second XRD peak intensity ratio of the second copper layer.

16. The semiconductor device of claim 11,
wherein, when an etching solution containing hydrogen peroxide and phosphoric acid or an etching solution containing hydrogen peroxide and citric acid is used, a copper etch rate of the first copper layer is lower than half a copper etch rate of the second copper layer.

17. The semiconductor device of claim 11,
wherein the bump structure further comprises:
a nickel layer interposed between the second copper layer and the solder ball, and
wherein a width of the nickel layer is greater than a width of the first copper layer and a width of the second copper layer.

18. A semiconductor device, comprising:
a pad disposed on a substrate; and
a bump structure disposed on the pad and electrically connected to the pad,
wherein the bump structure comprises:
a first copper layer and a second copper layer sequentially stacked on the pad; and
a solder ball on the second copper layer,
wherein a first X-ray diffraction (XRD) peak intensity ratio of (111) plane to (200) plane of the first copper layer is greater than a second XRD peak intensity ratio of (111) plane to (200) plane of the second copper layer, and
wherein the first XRD peak intensity ratio of the first copper layer is greater than two times the second XRD peak intensity ratio of the second copper layer.

19. The semiconductor device of claim 18,
wherein a twin boundary density in the first copper layer is greater than a twin boundary density in the second copper layer.

20. The semiconductor device of claim 18,
Wherein a thickness of the first copper layer is smaller than about 0.2 times a thickness of the second copper layer.

21. The semiconductor device of claim 18,
wherein the first copper layer has a thickness ranging from about 0.5 μm to about 3 μm.

22. The semiconductor device of claim 18,
wherein, when an etching solution containing hydrogen peroxide and phosphoric acid or an etching solution containing hydrogen peroxide and citric acid is used, a copper etch rate of the first copper layer is lower than half a copper etch rate of the second copper layer.

23. The semiconductor device of claim 18, further comprising:
an under-cut region formed on a sidewall of the first copper layer,
wherein a depth of the under-cut region ranges from about 0.2 μm to about 0.6 μm.

24. The semiconductor device of claim 23,
wherein a thickness of the first copper layer is greater than the depth of the under-cut region.

25. The semiconductor device of claim 23, further comprising:
an under-bump pattern between the pad and the first copper layer,
wherein a portion of the first copper layer at the same level as the under-cut region has a width that is smaller than that of the under-bump pattern.

26. The semiconductor device of claim 25,
wherein the under-bump pattern comprises:
a barrier pattern and a seed pattern that are sequentially stacked, and
wherein a width of the seed pattern is smaller than a width of the barrier pattern.

27. The semiconductor device of claim 18,
wherein the bump structure further comprises:
a nickel layer interposed between the second copper layer and the solder ball, and
wherein a width of the nickel layer is greater than a width of the first copper layer and a width of the second copper layer.

28. The semiconductor device of claim 27,
wherein the bump structure further comprises:
a third copper layer interposed between the nickel layer and the solder ball, and
wherein the first XRD peak intensity ratio of (111) plane to (200) plane of the first copper layer is greater than a third XRD peak intensity ratio of (111) plane to (200) plane of the third copper layer.

* * * * *